Feb. 14, 1956 L. DE FOREST 2,735,049

TRANSISTOR

Filed March 31, 1952

INVENTOR.
LEE DE FOREST
BY Fulwider & Mattingly
Attorneys

United States Patent Office 2,735,049

Patented Feb. 14, 1956

2,735,049

TRANSISTOR

Lee de Forest, Los Angeles, Calif.

Application March 31, 1952, Serial No. 279,507

17 Claims. (Cl. 317—235)

My invention relates generally to amplifying devices of the type used in the electronic art, of which the electron discharge tube, or vacuum tube, is an example. More especially my invention relates to a so-called solid amplying device known in the art as a transistor.

Heretofore, the amplification of an electric current has generally been accomplished by means of an electron discharge tube having three or more elements therein. More recently, devices known as transistors have been developed that are able, in many instances, to provide the desired amplification without requiring some of the external sources of power that an electron discharge tube requires. In general, these transistors make use of certain properties of germanium and its alloys. Some of the earlier transistors, known as point contact transistors, relied upon points or cat whiskers which made contact with a block of uniform germanium. More recently, a so-called junction transistor has been developed in which two germanium crystal blocks, having one type of impurity or dilutent therein, are placed on either side of a thin slice of germanium having a different type of impurity or dilutent in it. The two blocks are in intimate contact with the slice, and this type of transistor produces results that are materially superior to the earlier point contact type.

One form of the germanium is referred to as the negative or n-type germanium, and may, for example, contain arsenic as the impurity. The other type of germanium is referred to as the positive or p-type germanium, and contains a different impurity, for example gallium. Two types of junction transistors are generally considered, one being the n-p-n type and the other being the p-n-p type, these designations indicating the sequence of the types of germanium from one end of the transistor to the other.

While the junction transistor represents a material advance in the field, many of its characteristics can be greatly improved, and it is therefore a major object of my invention to provide an improved transistor of the junction type.

Another object of my invention is to provide such a transistor having an improved amplification factor, resulting in a diminution or elimination of the noise factor of the transistor relative to its amplifying power.

It is a further object of my invention to provide a junction transistor having the quality of "negative resistance" when used in circuits designed for this purpose, thereby providing further uses for the junction-type transistor.

Still another object of my invention is to provide a transistor having an additional or fourth connection that permits the use of this improved type of junction transistor in a variety of circuits resembling those used with a tetrode electron discharge tube.

It is a still further object of my invention to provide a light source, comparable to a light valve, making use of the transistor herein described, and particularly adapted for providing photographic records of varying electric currents.

These and other objects and advantages of my invention will become apparent from the following description of various forms thereof, and from the drawings illustrating those forms, in which.

Figure 1:
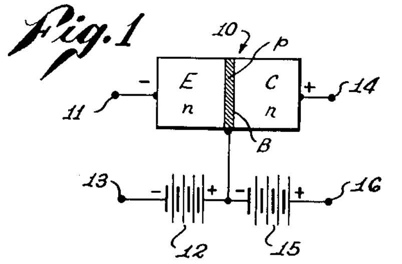
Fig. 1 is a schematic diagram illustrating one form of transistor and its connections.
Figure 2:
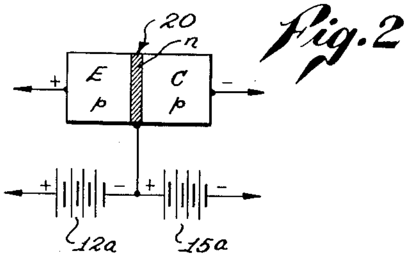
Fig. 2 is a schematic diagram of another form of transistor.

As previously mentioned, two different types of materials are used in the form of a junction transistor, one designated as the n-type and the other as the p-type. In Fig. 1, I have illustrated a transistor that is known as the n-p-n type, and consisting of end portions or blocks of n-type material, separated by a thin section or slice of p-type material. In Fig. 2, I have illustrated the assembly known as a p-n-p type, in which the end blocks are of p-type material, and the central section or slice is of n-type material. In either form, one of the end blocks, connected to the input terminals, is designated as the emitter, and the other end block, connected to the output terminals, is designated as the collector. The section or slice between the two end blocks is known as the body, and generally this forms a common connection between the input and output circuits. In the drawings, the emitter is designated by the letter E, the body by the letter B, and the collector by the letter C.

Generally the transistor 10, shown in Fig. 1, has its emitter connected to an input terminal 11, and the base connected through a source of power such as a battery 12 to another input terminal 13. The collector of the transistor may be connected to an output terminal 14, while the base is connected through a second source of power such as a battery 15 to the other output terminal 16. Normally, batteries 12 and 15 will be arranged so that the emitter has a negative polarity with respect to the base, and the collector is positive with respect thereto. However, under certain conditions, it may be desirable to reverse the polarity of the batteries 12 and 15, and this has been indicated in Fig. 2 where a transistor 20 has the reverse polarity, provided by the batteries *12a* and *15a*, applied to the emitter and collector, respectively.

The batteries 12 and 15 may be considered as a single battery, and the location of the base connection to this combined battery may be altered to suit the nature of the impedances of the input and output circuits connected to the transistor. Either the emitter, the collector, or the base electrode may be connected to earth, or grounded. The input load is preferably applied between the emitter and the base, and the output load between the collector and the base, particularly if the latter electrode is earthed or grounded.

I have found that if a thin layer of so-called electron-multiplier material, such as beryllium oxide or a silver magnesium alloy, is applied to the surface of the base electrode between the positive emitter or collector and the base, the electrons passing from the base into the collector or emitter are greatly multiplied in number. The electrons residing in the electron-multiplier material are released in relatively large numbers when impacted or acted upon by electrons driven into the multiplier material by an electromotive force. As a result, there is a greatly increased flow of electrons from the electron-multiplier layer into the adjoining conductor or semiconductor. Some of the electrons released from the multiplier layers are scattered, and may wander in undetermined directions, even counter to the impelling electromotive force. The majority of the freed electrons, however, will travel in the direction of the applied electromotive force.

Figure 3:
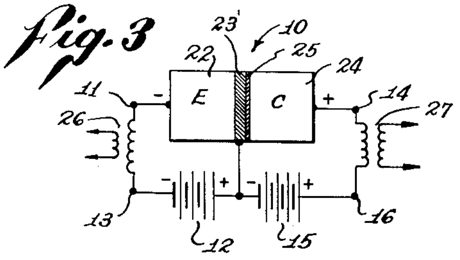
Fig. 3 is a schematic diagram illustrating the construction of my improved form of transistor, and indicating the method of connecting it into a circuit.

In Fig. 3 I have illustrated the construction of a junction transistor made in accordance with my invention, and connected in a manner previously indicated. The transistor 10 includes an emitter 22, a base 23, and a collector 24, all as previously described. In addition, a thin layer 25 of electron-multiplier material is placed between the base 23 and collector 24 to provide an increased electron flow into the collector. Furthermore, by way of example only and not as a limitation, I have indicated a transformer 26 connected to the input terminals 11 and 13, and have indicated a transformer 27 connected to the output terminals 14 and 16. Convenient means are thus provided, if desired, for isolating the input and output circuits, and for matching impedances.

The increased electron flow provided by the layer of electron-multiplier material 25 is equivalent to a reduction of the total resistance, or impedance, of the transistor assembly. The amplification factor of the transistor is considerably increased by the process here described, resulting in a diminution or elimination of the noise factor of the transistor relative to its amplifying power.

Figure 4:
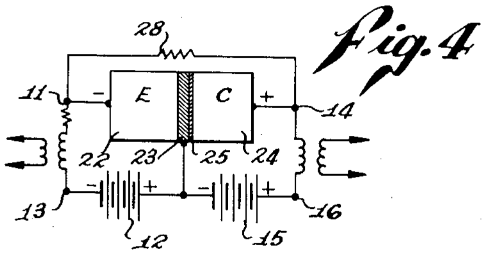
Fig. 4 is a schematic wiring diagram illustrating a method of connecting a junction transistor into a circuit to secure negative resistance characteristics.

This increased electron flow may even give to the transistor the quality of a "negative resistance," generating electronic energy proportional to the square, or some lesser power, of the impressed voltage or current. This condition is facilitated by connecting the emitter 22 and collector 24 by a resistor 28, as shown in Fig. 4.

Figure 5:
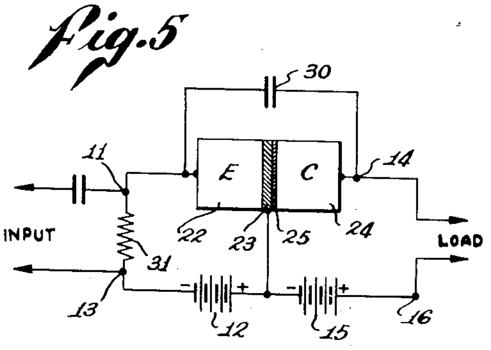
Fig. 5 is a schematic wiring diagram illustrating another method of securing negative resistance characteristics.

As an alternative method, the negative resistance characteristics may be obtained by connecting a suitable capacitor which may be of large capacity, between the emitter 22 and the collector 24. Such an arrangement is shown in Fig. 5, where a capacitor 30 is connected to the emitter 22 and collector 24 in a manner similar to the connection of the resistor 28 as shown in Fig. 4. When using the capacitor as indicated in Fig. 5, it is generally advantageous to connect a high resistance element 31 between the emitter 22 and the battery 12.

The thin layer of electron-multiplier material may be applied to the surface of the base 23, or of the emitter 22 or collector 24, in a variety of ways, such as by sputtering in an evacuated chamber, or by deposit from a fluid medium or solution. Alternatively, it may be applied to the surface as a paste by means of a very fine brush. The layer is allowed to dry thoroughly before the three members of the junction transistor are assembled and clamped together.

Figure 6:
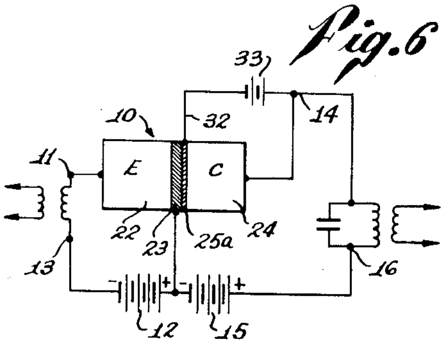
Fig. 6 is a schematic diagram illustrating the construction and connection of another form of junction transistor making use of my invention and capable of being connected in a circuit in a manner similar to a tetrode electron discharge tube.

As a further development of this invention, I may employ a very fine, thin wire mesh electrode embedded in the electron-multiplier, or secondary electron-emitting material, this mesh being connected to an additional outside conductor. A wiring diagram for such a transistor is shown in Fig. 6, where the emitter 22, base 23, and collector 24 of the transistor 10 are as previously described. However, the layer of electron-multiplier material **25*a* is provided with an external connection such as furnished by the wire mesh electrode previously mentioned, and this electrode is connected to the outside conductor 32. As indicated in Fig. 6, the conductor 32 may be connected to a source of power such as a battery 33, which in turn is connected to the output terminal 14**. This additional electrode element, connected to the electron-multiplier layer, permits the connection of this improved type of transistor in a variety of ways, including circuits resembling those of a tetrode electron discharge tube. Generally, the circuit of the electron-multiplier electrode will include an external battery or source of electromotive force, in series with the electron-multiplier electrode, and the emitter or collector terminal.

Figure 7:
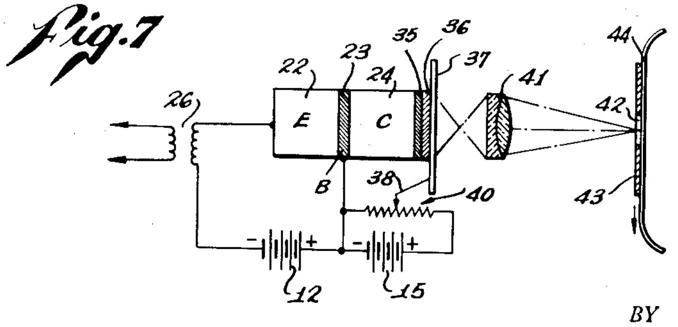
Fig. 7 is a diagram of my improved light source, making use of a juncture transistor.

In Fig. 7, I have illustrated another application of an electron-multiplier layer used in conjunction with a junction transistor, such as the n-p-n type shown in Figures 1 and 3–6. On the end of the collector block 24 of a junction transistor, I apply a layer of electron-multiplier material, indicated by the numeral 35. In contact with the outer face of the layer 35 is placed a thin layer 36 of cathodoluminescent material having a short period of retentivity or persistence, such as calcium tungstate. In contact with the cathodoluminescent layer 36 is a plate 37 of an electrically conducting transparent material such as a sheet of electrically conducting glass to whose conducting surface there is attached a conductor 38 that is connected to the positive terminal of battery 15. Preferably, a voltage regulating element 40 is included in this circuit.

The input circuit of the transistor includes a transformer 26, the primary or input terminals of which are connected to a source of modulated current, such as a microphone. The signal or modulated current that is applied to the primary of the transformer 26 will be amplified by the transistor, and the amplified current will pass through the collector 24. Upon leaving the collector 24, the electrons constituting the flow of current pass into the electron-multiplying layer 35 and thus release additional electrons. These electrons then impinge upon the layer of fluorescent material 36 to cause a fluorescence. The light so produced varies in accordance with the amplitude of the input signal, and the combination here shown of transistor and fluorescent light source may advantageously be used for photographically recording the fluctuations of the input current.

To accomplish this, the light emanating from the surface of the fluorescent layer 36 is focused by a lens 41 upon a slit 42 of a mask or other opaque member 43. Behind the mask 43 is a film 44 that is moved in a direction across the slit, and a record of the variations in the input signal will thus be photographically recorded.

The combination here shown of transistor, electron-multiplier surface, and fluorescent layer adjacent thereto, constitutes an exceedingly small, compact, and simple unit for photographic recording of modulated electronic currents from whatever suitable source or for whatever purpose desired.

Figure 8:
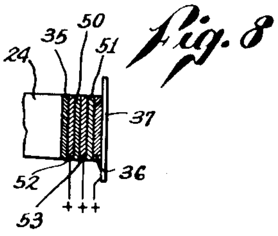
Fig. 8 is a partial view of a modified form of my improved light source.

The intensity of the light generated in the film of fluorescent material may be greatly increased by the intervention of a second, or even a third, layer of electron-multiplying material between the end of the collector and the fluorescent material. Such a construction is indicated in Fig. 8, where a second layer 50 and a third layer 51 of electron-multiplying material are shown. A very thin sheet 52 and 53 of magnesium or aluminum metal is inserted between each two layers of electron-multiplying material, and a progressively higher voltage is applied to each successive metallic sheet. For example, twenty-five volts may be applied to the first metallic sheet 52, fifty volts to the second sheet 53, and seventy-five volts to the conducting surface of the glass plate 37. In addition, it will be realized that the transistor may include a layer of electron-multiplying material between the base and the collector, as previously described.

From the foregoing, it will be seen that I have provided an improved junction transistor fully capable of achieving the objects and securing the advantages heretofore set forth. In addition, I have combined a transistor with a fluorescent layer to provide a light source of small size and light weight that requires a minimum of external components and power sources.

While I have shown and described various forms of my invention, it will be apparent to those skilled in the art that modifications may be made therein without departing from the broad scope of my invention. Consequently, I do not wish to be restricted to the particular form or arrangement of parts herein described and shown except as limited by my claims.

I claim:

1. An amplifier of the transistor type which includes: an emitter; a collector; a base between said emitter and collector and in electrical contact therewith; and a layer of electron-multiplier material between said base and at least one of the adjoining members.

2. An amplifier of the transistor type which includes: an emitter composed of a first type semi-conductor; a collector composed of said first type semi-conductor; a base between said emitter and collector and in electrical contact therewith, composed of a second type semi-conductor; and a layer of electron-multiplier material between a surface of said base and an adjoining surface of one of said members composed of said first type semi-conductor.

3. An amplifier of the transistor type which includes: an emitter; a collector; a base between said emitter and collector and in electrical contact therewith; a layer of electron-multiplier material in the path of current flowing through said transistor; and means for completing an external circuit to said layer of electron-multiplier material.

4. An amplifier of the transistor type which includes: an emitter; a collector; a base between said emitter and collector and in electrical contact therewith; a layer of electron-multiplier material between said base and an adjoining member in electrical contact therewith; and connector means for completing an external circuit to said layer of electron-multiplier material.

5. An amplifier of the transistor type which includes: an emitter composed of a first type semi-conductor; a collector composed of said first type semi-conductor; a base between said emitter and collector and in electrical contact therewith, composed of a second type semi-conductor; a layer of electron-multiplier material between a surface of said base and an adjoining surface of one of said members composed of said first type semi-conductor; and connector means for completing an external circuit to said layer of electron-multiplier material.

6. An amplifier of the transistor type which includes: an emitter composed of a first type semi-conductor; a base composed of a second type semi-conductor adjacent said emitter and in electrical contact therewith; a layer of electron-multiplier material in intimate contact with a surface of said base; and a collector composed of said first type semi-conductor in intimate contact with said layer of electron-multiplier material.

7. An amplifier as described in claim 6, having connector means for completing an external circuit to said layer of electron-multiplier material.

8. An amplifier of the transistor type which includes: an emitter composed of a first type semi-conductor; a layer of electron-multiplier material in intimate contact with a surface of said emitter; a base composed of a second type semi-conductor in intimate contact with said layer of electron-multiplier material; and a collector composed of said first type semi-conductor adjacent said base and in electrical contact therewith.

9. An amplifier as described in claim 8, having connector means for completing an external circuit to said layer of electron-multiplier material.

10. A device of the type described which includes: an emitter; a collector; a base between said emitter and collector; a layer of electron-multiplier material on an external surface of said collector; and a layer of cathodoluminescent material in intimate contact with said layer of electron-multiplier material.

11. A device of the type described which includes: a transistor having input and output ends; a layer of electron-multiplier material on the output end of said transistor and in the path of current flowing therethrough; and a layer of cathodoluminescent material adjacent said layer of electron-multiplier material.

12. A device of the type described which includes: a transistor having input and output ends; a layer of electron-multiplier material on the output end of said transistor and in the path of current flowing therethrough; a layer of cathodoluminescent material adjacent said layer of electron-multiplier material; and a light transparent electrically conducting member adjacent said layer of cathodoluminescent material.

13. A device of the type described which includes: a transistor having input and output ends; a layer of electron-multiplier material on the output end of said transistor; a conducting layer adjacent said layer of electron-multiplier material; a second layer of electron-multiplier material adjacent said conducting layer; and a layer of cathodoluminescent material adjacent said second layer of electron-multiplier material.

14. A device of the type described which includes: a transistor having input and output ends; a layer of electron-multiplier material on the output end of said transistor; a conducting layer adjacent said layer of electron-multiplier material; a second layer of electron-multiplier material adjacent said conducting layer; a layer of cathodoluminescent material adjacent said second layer of electron-multiplier material; and a light transparent electrically conducting member adjacent said layer of cathodoluminescent material.

15. A device of the type described which includes: an emitter; a collector; a base between said emitter and collector; a layer of electron-multiplier material on said collector and in the path of current flowing therethrough; a conducting layer adjacent said layer of electron-multiplier material; a second layer of electron-multiplier material adjacent said conducting layer; a layer of cathodoluminescent material adjacent said second layer of electron-multiplier material; and a light transparent electrically conducting member adjacent said layer of cathodoluminescent material.

16. An amplifier of the transistor type which includes: an emitter of a first type semi-conductor; a base of a second type semi-conductor adjacent said emitter and in electrical contact therewith; a collector of said first type semi-conductor adjacent said base and in electrical contact therewith; and a layer of electron-multiplier material on a face of one of said previously mentioned elements and in the path of current flowing through said transistor.

17. An amplifier of the transistor type which includes: an emitter of a first type semi-conductor; a base of a second type semi-conductor having one of its faces in electrical contact with a face of said emitter; a collector of said first type semi-conductor having one of its faces in electrical contact with another face of said base; and a layer of electron-multiplier material, different from both of said first and second types of semi-conductor, on a face of one of said previously mentioned elements and in the path of current flowing through said transistor.

References Cited in the file of this patent

UNITED STATES PATENTS

| | | |
|---|---|---|
| 2,508,098 | Chilowsky | May 16, 1950 |
| 2,561,411 | Pfann | July 24, 1951 |
| 2,566,349 | Mager | Sept. 4, 1951 |
| 2,569,347 | Shockley | Sept. 25, 1951 |
| 2,683,794 | Briggs et al. | July 13, 1954 |